(12) United States Patent
Gotrik et al.

(10) Patent No.: US 10,563,030 B2
(45) Date of Patent: Feb. 18, 2020

(54) EXTENSIBLE BARRIER FILMS, ARTICLES EMPLOYING SAME AND METHODS OF MAKING SAME

(71) Applicant: 3M INNOVATIVE PROPERTIES COMPANY, St. Paul, MN (US)

(72) Inventors: Kevin W. Gotrik, Hudson, WI (US); Christopher S. Lyons, St. Paul, MN (US); Gerald S. Deeb, Mendola Heights, MN (US); Peihui Zhang, Woodbury, MN (US); Ronald P. Swanson, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 87 days.

(21) Appl. No.: 16/063,584

(22) PCT Filed: Dec. 12, 2016

(86) PCT No.: PCT/US2016/066202
§ 371 (c)(1),
(2) Date: Jun. 18, 2018

(87) PCT Pub. No.: WO2017/106107
PCT Pub. Date: Jun. 22, 2017

(65) Prior Publication Data
US 2019/0002660 A1    Jan. 3, 2019

Related U.S. Application Data

(60) Provisional application No. 62/269,610, filed on Dec. 18, 2015.

(51) Int. Cl.
*C08J 7/04* (2006.01)
*B05D 7/04* (2006.01)
(Continued)

(52) U.S. Cl.
CPC .............. *C08J 7/045* (2013.01); *B05D 7/04* (2013.01); *B32B 3/28* (2013.01); *B32B 3/30* (2013.01);
(Continued)

(58) Field of Classification Search
CPC .. C08J 7/045; B65D 2565/387; B65D 65/403; B32B 2307/7244;
(Continued)

(56) References Cited

U.S. PATENT DOCUMENTS 6,150,007 A    11/2000  Oshima
6,338,870 B1    1/2002  Jaccoud
(Continued)

FOREIGN PATENT DOCUMENTS

EP          2341566      7/2011
WO    WO 2001-054886    8/2001
(Continued)

OTHER PUBLICATIONS

International Search Report for PCT International Application No. PCT/US2016/066202, dated Mar. 23, 2017, 7pgs.

*Primary Examiner* — Scott R. Walshon
*Assistant Examiner* — Jasper Saberi
(74) *Attorney, Agent, or Firm* — Qiang Han

(57) ABSTRACT

There is provided a barrier film including a barrier layer having two opposing major surfaces, a first organic layer in direct contact with one of the opposing major surfaces of the barrier layer; a second organic layer in direct contact with the other of the opposing major surfaces of the barrier layer; and a substrate in direct contact with the first organic layer or the second organic layer; wherein the barrier layer comprises buckling deformations with average spacing smaller than average spacing of the buckling deformations in the first or second organic layer.

14 Claims, 1 Drawing Sheet

(51) Int. Cl.

| | |
|---|---|
| *C23C 14/00* | (2006.01) |
| *C23C 14/08* | (2006.01) |
| *B32B 15/04* | (2006.01) |
| *H01L 51/52* | (2006.01) |
| *B32B 15/08* | (2006.01) |
| *B65D 65/40* | (2006.01) |
| *B32B 3/30* | (2006.01) |
| *B32B 3/28* | (2006.01) |
| *C23C 14/10* | (2006.01) |
| *C23C 14/58* | (2006.01) |

(52) U.S. Cl.
CPC ............. *B32B 15/04* (2013.01); *B32B 15/08* (2013.01); *B65D 65/403* (2013.01); *C23C 14/0042* (2013.01); *C23C 14/08* (2013.01); *C23C 14/10* (2013.01); *C23C 14/5806* (2013.01); *H01L 51/5243* (2013.01); *H01L 51/5253* (2013.01); *B32B 2307/7244* (2013.01); *B32B 2307/7246* (2013.01); *B32B 2307/736* (2013.01); *B65D 2565/387* (2013.01); *C08J 2367/02* (2013.01); *C08J 2435/02* (2013.01); *Y02W 30/806* (2015.05)

(58) Field of Classification Search
CPC ..... B32B 2307/7246; B32B 3/28; B32B 3/30; B32B 15/04; B32B 15/08; H01L 51/5253
See application file for complete search history.

(56) References Cited

U.S. PATENT DOCUMENTS

| | | |
|---|---|---|
| 6,869,666 B2 | 3/2005 | Deeb |
| 7,018,713 B2 | 3/2006 | Padiyath |
| 7,465,678 B2 | 12/2008 | Bhattacharya |
| 8,608,323 B2 | 12/2013 | Muller |
| 8,624,487 B2 | 1/2014 | Han |
| 8,658,248 B2 | 2/2014 | Anderson |
| 8,963,423 B2 | 2/2015 | Han |
| 8,979,536 B2 | 3/2015 | Jones |
| 8,987,758 B2 | 3/2015 | Han |
| 2009/0053542 A1 | 2/2009 | Kuwata |
| 2011/0210344 A1 | 9/2011 | Han |
| 2011/0317269 A1 | 12/2011 | Paolilli |
| 2012/0243092 A1* | 9/2012 | Muller ............... H01L 31/0392 359/507 |
| 2013/0140528 A1 | 6/2013 | De Kok |
| 2014/0140020 A1 | 5/2014 | Rogers |
| 2017/0313132 A1* | 11/2017 | Kresge ................. B32B 27/302 |

FOREIGN PATENT DOCUMENTS

| | | |
|---|---|---|
| WO | WO 2002-11978 | 2/2002 |
| WO | WO 2013-062486 | 5/2013 |
| WO | WO 2017-106078 | 6/2017 |

* cited by examiner

EXTENSIBLE BARRIER FILMS, ARTICLES EMPLOYING SAME AND METHODS OF MAKING SAME

FIELD

The present disclosure relates to barrier films. The present disclosure further provides articles employing these barrier films and methods of making these barrier films.

BACKGROUND

Many electronic devices are sensitive to environmental gases and liquids and are prone to degradation on permeation of the environmental gases and liquids such as oxygen and water vapor. Inorganic or hybrid inorganic/organic layers have been used in thin films for electrical, packaging and decorative applications to prevent the degradation. For example, multilayer stacks of inorganic or hybrid inorganic/organic layers can be used to make barrier films resistant to moisture permeation. Multilayer barrier films have also been developed to protect sensitive materials from damage due to water vapor. The water sensitive materials can be electronic components such as organic, inorganic, and hybrid organic/inorganic semiconductor devices. While the technology of the prior art may be useful, there exists a need for better barrier films useful for packaging electronic components.

SUMMARY

In one aspect, the present disclosure provides a barrier film comprising a barrier layer having two opposing major surfaces; a first organic layer in direct contact with one of the opposing major surfaces of the barrier layer; a second organic layer in direct contact with the other of the opposing major surfaces of the barrier layer; and a substrate in direct contact with the first organic layer or the second organic layer; wherein the barrier layer comprises buckling deformations with average spacing smaller than average spacing of the buckling deformations in the first or second organic layer.

In another aspect, the present disclosure provides a barrier film comprising: a barrier layer having two opposing major surfaces, wherein the barrier layer comprises buckling deformations; a first organic layer in direct contact with one of the opposing major surfaces of the barrier layer; a second organic layer in direct contact with the other of the opposing major surfaces of the barrier layer; and a substrate in direct contact with the first organic layer or the second organic layer; wherein each of the first organic layer and the second organic layer has a conformable surface conforming to a shape of the barrier layer; and wherein each of the first organic layer and the second organic layer has a substantially flat surface disposed opposite to and spaced apart from the conformable surface.

In another aspect, the present disclosure provides an article comprising a device disposed on the barrier film of the present disclosure, wherein the barrier film is stretched to no less than 1% relative to its unstretched state.

In another aspect, the present disclosure provides a method of making the barrier film of the present disclosure, comprising: depositing a barrier layer between a first organic layer and a second organic layer to form a layer construction; and applying heat to the layer construction.

Various aspects and advantages of exemplary embodiments of the present disclosure have been summarized. The above Summary is not intended to describe each illustrated embodiment or every implementation of the present disclosure. Further features and advantages are disclosed in the embodiments that follow. The Drawings and the Detailed Description that follow more particularly exemplify certain embodiments using the principles disclosed herein.

Definitions

For the following defined terms, these definitions shall be applied for the entire Specification, including the claims, unless a different definition is provided in the claims or elsewhere in the Specification based upon a specific reference to a modification of a term used in the following definitions:

The terms "a", "an", and "the" include plural referents unless the content clearly dictates otherwise. Thus, for example, reference to a material containing "a compound" includes a mixture of two or more compounds.

The term "layer" refers to any material or combination of materials on or overlaying a substrate. The term "separated by" to describe the position of a layer with respect to another layer and the substrate, or two other layers, means that the described layer is between, but not necessarily contiguous with, the other layer(s) and/or substrate.

The term "(co)polymer" or "(co)polymeric" includes homopolymers and copolymers, as well as homopolymers or copolymers that may be formed in a miscible blend, e.g., by coextrusion or by reaction, including, e.g., transesterification. The term "copolymer" includes random, block, graft, and star copolymers.

BRIEF DESCRIPTION OF THE DRAWINGS

The disclosure may be more completely understood in consideration of the following detailed description of various embodiments of the disclosure in connection with the accompanying figures, in which.

While the above-identified drawings, which may not be drawn to scale, set forth various embodiments of the present disclosure, other embodiments are also contemplated, as noted in the Detailed Description. In all cases, this disclosure describes the presently disclosed invention by way of representation of exemplary embodiments and not by express limitations. It should be understood that numerous other modifications and embodiments can be devised by those skilled in the art, which fall within the scope and spirit of this disclosure.

DETAILED DESCRIPTION

Before any embodiments of the present disclosure are explained in detail, it is understood that the invention is not limited in its application to the details of use, construction, and the arrangement of components set forth in the following description. The invention is capable of other embodiments and of being practiced or of being carried out in various ways that will become apparent to a person of ordinary skill in the art upon reading the present disclosure. Also, it is understood that the phraseology and terminology used herein is for the purpose of description and should not be regarded as limiting. The use of "including," "comprising," or "having" and variations thereof herein is meant to encompass the items listed thereafter and equivalents thereof as well as additional items. It is understood that other embodiments may be utilized and structural or logical changes may be made without departing from the scope of the present disclosure.

As used in this Specification, the recitation of numerical ranges by endpoints includes all numbers subsumed within that range (e.g. 1 to 5 includes 1, 1.5, 2, 2.75, 3, 3.8, 4, and 5, and the like).

Unless otherwise indicated, all numbers expressing quantities or ingredients, measurement of properties and so forth used in the Specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Inorganic layers of barrier films are susceptible to strain induced failure. Typically, when an inorganic oxide is exposed to conditions that induce more than 0.5% tensile strain, then the inorganic oxide will experience a multitude of in-plane fractures lowering its diffusion properties by orders of magnitude. The barrier film of the present disclosure provides a high performing barrier film.

Figure 1:
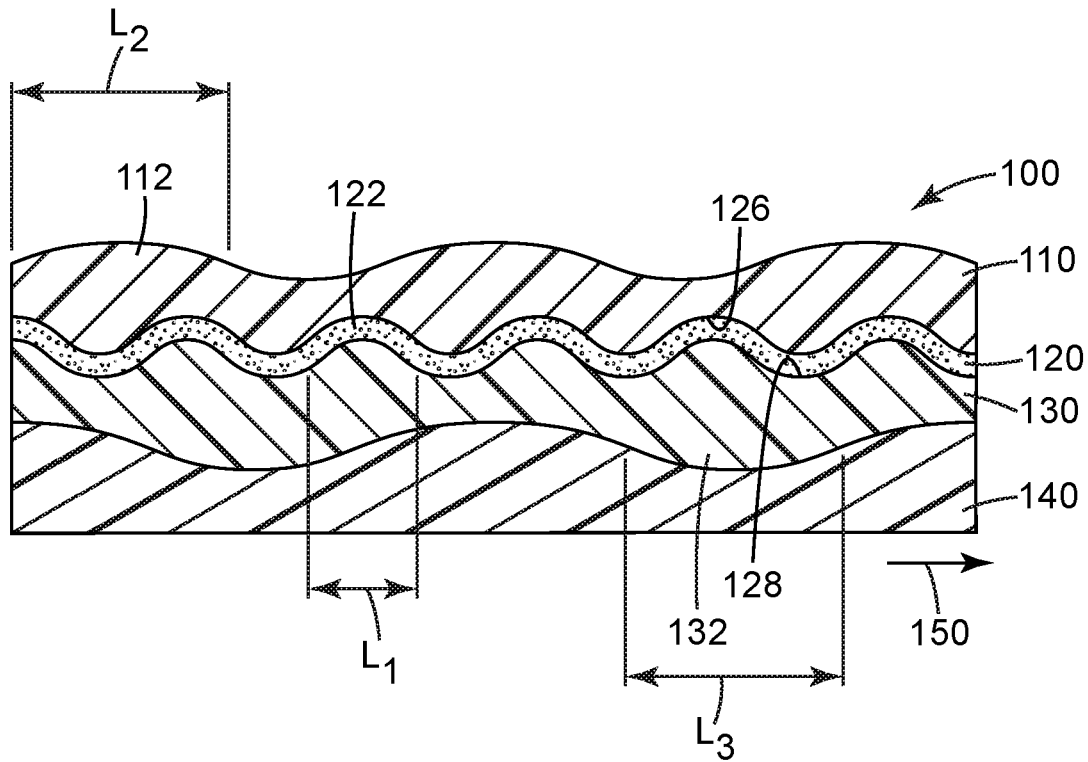
FIG. 1 is a side view of an exemplary barrier film according to the present invention.

The present disclosure provides barrier films, articles employing these barrier films and methods of making these barrier films. Referring now to FIG. 1, an exemplary barrier film 100 according to the present disclosure is illustrated. Barrier film 100 includes a barrier layer 120 which has first 126 and second 128 opposing major surfaces. In the embodiment shown in FIG. 1, in direct contact with the first opposing major surface 126 of the barrier layer 120 is a first organic layer 110 and a second organic layer 130 is in direct contact the second opposing major surface 128 of the barrier layer 120. In other embodiments, the layer to be described as the second organic layer 130 may be in direct contact with the first opposing major surface 126 of the barrier layer 120 and the first organic layer 110 is in direct contact with the second opposing major surface 128 of the barrier layer 120. Barrier film 100 may also include a substrate 140 in direct contact with the first organic layer 110 or the second organic layer 130. In the embodiment of FIG. 1, substrate 140 is in direct contact with the second organic layer 130. Alternatively, substrate 140 can be in direct contact with the first organic layer 110.

Barrier layer 120 has buckling deformations 122. First organic layer 110 or second organic layer 130 may also have buckling deformations 112 or 132. As shown in FIG. 1, buckling deformations 122 of barrier layer 120 have a spacing L1, buckling deformations 112 of first organic layer 110 have a spacing L2, and buckling deformations 132 of second organic layer 130 have a spacing L3. In some embodiments, the average spacing L1 is smaller than average spacing L2 or average spacing L3. In some embodiments, buckling deformations may be irregular. In some embodiments, the spacing L1 of buckling deformations 122 may be no more than 400 nm, no more than 300 nm, no more than 200 nm, no more than 100 nm, no more than 50 nm, no more than 40 nm, no more than 30 nm, or no more than 20 nm. In some embodiments, the length L1 of buckling deformations 122 may be no less than 2 nm, no less than 5 nm, no less than 10 nm, no less than 20 nm.

Figure 2:
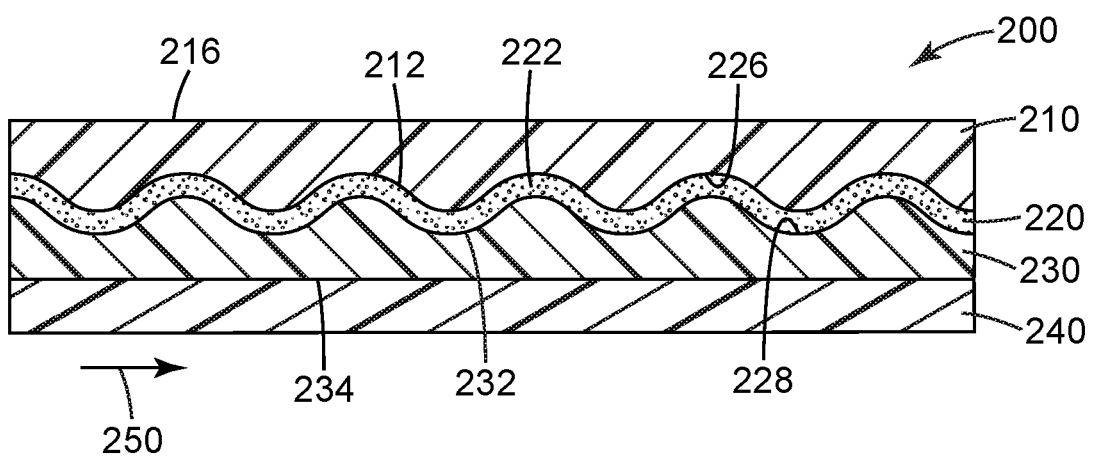
FIG. 2 is a side view of an embodiment of barrier film according to the present invention.

Referring now to FIG. 2, another embodiment of barrier film 200 according to the present disclosure is illustrated. In this embodiment, in direct contact with the first opposing major surface 226 of the barrier layer 220 is a first organic layer 210 and a second organic layer 230 is in direct contact with the second opposing major surface 228 of the barrier layer 220. In other embodiments, the layer to be described as the second organic layer 230 may be in direct contact with the first opposing major surface 226 of the barrier layer 220 and the first organic layer 210 is in direct contact with the second opposing major surface 228 of the barrier layer 220. Barrier film 200 may also include a substrate 240 in direct contact with the first organic layer 210 or the second organic layer 230. In the embodiment of FIG. 2, substrate 240 is in direct contact with the second organic layer 230. Alternatively, substrate 240 can be in direct contact with the first organic layer 210. In the embodiment of FIG. 2, the first organic layer 220 has a conformable surface 212 conforming to a shape of the barrier layer and a substantially flat surface 214 disposed opposite to and spaced apart from the conformable surface 212. The second organic layer has a conformable surface 232 conforming to a shape of the barrier layer and a substantially flat surface 234 disposed opposite to and spaced apart from the conformable surface 232. Barrier layer 220 may also have buckling deformations 222.

Buckling deformations 112, 122, 132, or 222 may project along a first direction 150 or 250 as shown in FIG. 1 or 2. In some embodiments, buckling deformations 112, 122, 132, or 222 may project along a second direction, which is different from the first direction 150 or 250. In some embodiments, buckling deformations 112, 122, 132, or 222 may project along both the first direction and the second direction. In some embodiments, the first direction and the second direction can be mutually perpendicular to each other. For example, the first direction is along the x-axis of the barrier layer and the second direction is along the y-axis of the barrier layer. However, it should be appreciated that the first direction and the second direction can also be along other axes of the barrier layer. For example, if the barrier layer, when viewed from the top, is rectangular in shape, then first direction can be along a length of the rectangular surface and the second direction can be along the breadth of the rectangular surface.

Barrier layers 120 and 220 are characterized by buckling deformations. Buckling deformations can provide technical benefits. For example, by forming buckling deformations in barrier layer, a predetermined amount of compressive stress and additional surface area can be introduced into the barrier layer. In effect, the barrier layer builds up an amount of total surface area greater than the given projected two-dimensional area that is then unraveled when the barrier film undergoes tensile strain. Therefore, when the barrier film is stretched, the buckling deformations can alleviate stress and help the barrier film elongate, thereby reducing strain induced failure. This allows the barrier film of the present disclosure to bend in at least one direction in a plane along the surface of the barrier film in reaction to at least one of thermal stress, mechanical stress, and load caused by deformation of an adjoining substrate or layer, thereby reducing build-up of the stress or the load and preventing the barrier film from fracturing or cracking. The stress or the load can be a result of an outside force. The stress or the load can also be caused due to temperature variation in combination with different thermal expansion coefficients of barrier layers and adjoining layers or substrate. Further, the stress or the load can also be caused due to deformation of the adjoining layers or substrate. Also, the stress or the load can be caused due to humidity absorption and resulting expansion of the adjoining layers or substrate.

Substrates

The substrate 140 can be heat-shrinkable. The heat-shrinkable substrate can shrink at a predetermined temperature. Suitable substrate 140 can be conveniently an organic polymeric layer that is processed to be heat-shrinkable by any suitable means. Semicrystalline or amorphous polymers can be made heat-shrinkable by orienting them at a temperature above their glass transition temperature, Tg, and then cooling. Examples of useful semicrystalline polymeric films include polyolefins such as polyethylene (PE), polypropylene (PP), and syndiotactic polystyrene (sPS); polyesters such as polyethylene terephthalate (PET), polyethylene napthalate (PEN), and polyethylene-2,6-naphthalate; fluoropolymers such as polyvinylidene difluoride, and ethylene: tetrafluoroethylene copolymers (ETFE); polyamides such as Nylon 6 and Nylon 66; polyphenylene oxide, and polyphenylene sulfide. Examples of amorphous polymer films include polymethylmethacrylate (PMMA), polycarbonate (PC), polyether sulfone (PES), atactic polystyrene (aPS), polyvinyl chloride (PVC), and norbornene based cyclic olefin polymer (COP) and cyclic olefin copolymer (COC). Some polymer materials are available in both semicrystalline and amorphous forms. Semicrystalline polymers such as those listed above can also be made heat-shrinkable by heating to the peak crystallization temperature and cooling.

Biaxially or uniaxially oriented polyethylene terephthalate (PET) with a thickness of approximately 0.002 inch (0.05 mm) is considered a convenient choice, as is biaxially oriented polypropylene (BOPP) film. Biaxially oriented polypropylene (BOPP) is commercially available from several suppliers including: ExxonMobil Chemical Company of Houston, Tex.; Continental Polymers of Swindon, UK; Kaisers International Corporation of Taipei City, Taiwan and PT Indopoly Swakarsa Industry (ISI) of Jakarta, Indonesia. Other examples of suitable film material are taught in WO 02/11978, titled "Cloth-like Polymeric Films," (Jackson et al.). In some embodiments, the substrate may be a lamination of two or more polymeric layers.

Organic Layer

The first and second organic layers may be made from the same material or different materials. The organic layers may be made of at least one selected from among, but not limited to, organic polymers, polymers including inorganic elements, organometallic polymers, hybrid organic/inorganic polymer systems, and combinations thereof. The organic polymers may be at least one selected from among, but not limited to, urethanes, polyamides, polyimides, fluoropolymers, polybutylenes, isobutylene isoprene, polyolefins, epoxies, thiol-ernes, parylenes, benzocyclobutadiene, polynorbornenes, polyarylethers, polycarbonates, alkyds, polyaniline, ethylene vinyl acetate, ethylene acrylic acid, and combinations thereof. The polymers including inorganic elements may be at least one selected from among, but not limited to, silicones, polyphosphazenes, polysilazanes, polycarbosilanes, polycarboranes, carborane siloxanes, polysilanes, phosphonitriles, sulfur nitride polymers, siloxanes, polyorganotitanates, polyorganozirconates, and combinations thereof. The organometallic polymers may be at least one selected from among, but not limited to, organometallic polymers of main group metals, transition metals, and lanthanide/actinide metals, and combinations thereof. The hybrid organic/inorganic polymer systems may be at least one selected from among, but not limited to, organically modified silicates, preceramic polymers, polyimide-silica hybrids, (meth)acrylate-silica hybrids, polydimethylsiloxane-silica hybrids, and combinations thereof.

In some embodiments, the first organic layer or the second organic layer can include an acrylate or an acrylamide. When the organic layers are to be formed by flash evaporation of the monomer, vapor deposition, followed by crosslinking, volatilizable acrylate and methacrylate (referred to herein as "(meth)acrylate") or acrylamide or methacrylamide (referred to herein as "(meth)acrylamide") monomers are useful, with volatilizable acrylate monomers being preferred. A suitable (meth)acrylate or (meth) acrylamide monomer has sufficient vapor pressure to be evaporated in an evaporator and condensed into a liquid or solid coating in a vapor coater.

Examples of suitable monomers include, but are not limited to, hexanediol diacrylate; ethoxyethyl acrylate; cyanoethyl (mono)acrylate; isobornyl (meth)acrylate; octadecyl acrylate; isodecyl acrylate; lauryl acrylate; beta-carboxyethyl acrylate; tetrahydrofurfuryl acrylate; dinitrile acrylate; pentafluorophenyl acrylate; nitrophenyl acrylate; 2-phenoxyethyl (meth)acrylate; 2,2,2-trifluoromethyl (meth)acrylate; diethylene glycol diacrylate; triethylene glycol di(meth)acrylate; tripropylene glycol diacrylate; tetraethylene glycol diacrylate; neo-pentyl glycol diacrylate; propoxylated neopentyl glycol diacrylate; polyethylene glycol diacrylate; tetraethylene glycol diacrylate; bisphenol A epoxy diacrylate; 1,6-hexanediol dimethacrylate; trimethylol propane triacrylate; ethoxylated trimethylol propane triacrylate; propylated trimethylol propane triacrylate; tris(2-hydroxyethyl)-isocyanurate triacrylate; pentaerythritol triacrylate; phenylthioethyl acrylate; naphthloxyethyl acrylate; neopentyl glycol diacrylate, MIRAMER M210 (available from Miwon Specialty Chemical Co., Ltd., Korea), KAYARAD R-604 (available from Nippon Kayaku Co., Ltd., Tokyo, Japan), epoxy acrylate under the product number RDX80094 (available from RadCure Corp., Fairfield, N.J.); and mixtures thereof. A variety of other curable materials can be included in the polymer layer, such as, e.g., vinyl ethers, vinyl mapthalene, acrylonitrile, and mixtures thereof.

In particular, tricyclodecane dimethanol diacrylate is considered suitable. It is conveniently applied by, e.g., condensed organic coating followed by UV, electron beam, or plasma initiated free radical vinyl polymerization. A thickness between about 250 and 10000 nm is considered convenient, with approximately between about 750 and 5000 nm in thickness being considered particularly suitable. In some embodiments, thickness of organic layer can be between about 1000 and 3000 nm.

Barrier Layer

The barrier layer 120 may include at least one selected from the group consisting of individual metals, two or more metals as mixtures, inter-metallics or alloys, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

In some embodiments, the barrier layer 120 may conveniently be formed of metal oxides, metal nitrides, metal oxy-nitrides, and metal alloys of oxides, nitrides and oxy-nitrides. In one aspect the barrier layer 120 may include a metal oxide. In some embodiments, the barrier layer 120 may include at least one selected from the group consisting of silicon oxides such as silica, aluminum oxides such as alumina, titanium oxides such as titania, indium oxides, tin oxides, indium tin oxide (ITO), halfnium oxide, tantalum oxide, zirconium oxide, zinc oxide, niobium oxide, and combinations thereof. Preferred metal oxides may include aluminum oxide, silicon oxide, silicon aluminum oxide, aluminum-silicon-nitride, and aluminum-silicon-oxy-nitride, CuO, $TiO_2$, ITO, ZnO, aluminum zinc oxide, $ZrO_2$, and yttria-stabilized zirconia. Preferred nitrides may include $Si_3N_4$ and TiN. The barrier layer 120 can typically be prepared by reactive evaporation, reactive sputtering, chemical vapor deposition, plasma enhanced chemical vapor deposition, and atomic layer deposition. Preferred methods include vacuum preparations such as reactive sputtering and plasma enhanced chemical vapor deposition, and atomic layer deposition.

The barrier layer is conveniently applied as a thin layer. The barrier layer material, e.g. silicon aluminum oxide, can for example, provide good barrier properties, as well as good interfacial adhesion to organic layers. Such layers are conveniently applied by sputtering, and a thickness between about 5 and 100 nm is considered convenient, with approximately 27 nm in thickness being considered particularly suitable.

Methods of Making

In some embodiments, the barrier film of the present disclosure can be made by heat shrinking. A barrier layer is deposited between a first organic layer and a second organic layer to form a layer construction. The first organic layer and the second organic layer can be cured. In the absence of delamination, buckling deformations will occur upon a critical amount of compression in the stiffer organic layer if coherent deformation of the softer organic layer is possible. This is possible for example when the ratio of the moduli of the organic layers (including the substrate) is sufficiently large and the ratio of the layer thicknesses is sufficiently small. I.e. a thin high modulus organic layer needs to be supported by a sufficiently thick and low modulus layer to buckle upon sufficient compression. Alternatively, the first organic layer or the second organic layer can be deposited on a heat-shrinkable substrate and the barrier layer is deposited between a first organic layer and a second organic layer to form a layer construction. After heat-shrinking this construction, the barrier film formed by the above described method, can have buckling deformations as shown in FIG. 1 or 2.

Unless otherwise specified, the barrier layer of the various embodiments may be deposited by any suitable method, for example, by any one of sputtering, evaporation, chemical vapor deposition, plasma enhanced chemical vapor deposition, sublimation, electron cyclotron resonance-plasma enhanced chemical vapor deposition, physical vapor deposition, atomic layer deposition, and combinations thereof.

The first and second organic layers may be deposited by any suitable method, for example, by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating), die coating (e.g., slot die coating), spin coating, dip coating, or spray coating (e.g., electrostatic spray coating or ink jet coating), then crosslinked as set out above. The organic layers can also be formed by applying a layer containing an oligomer or polymer in solvent and drying the thus-applied layer to remove the solvent.

The barrier film of the present disclosure can also be formed by pre-straining a reversibly stretchable film. In some embodiments, the reversibly stretchable film can be formed of a reversibly stretchable material, such as an elastomer. The reversibly stretchable film is pre-stretched by a predetermined pre-stretch percentage represented by X %. The pre-stretched percentage X % can be in the range of about 0.5% to about 500%, about 0.5% to about 50%, about 0.5% to about 100%. The strained stretchable film is laminated to a rigid polymeric or metal substrate and a barrier layer is deposited on the strained stretchable film with techniques described above. After a first organic layer is deposited on the barrier layer, the reversibly stretchable film is released from the rigid polymeric or metal substrate and relaxed. Buckling deformations formed by this method has a wavy or buckled profile. Optionally, an adhesive can be deposited between the rigid substrate and the reversibly stretchable film.

Properties

The barrier film or article employing the barrier film can have a water vapor transmission rate of less than 0.1 $g/m^2/day$ after 1%, 5%, 10% or 20% uniaxial or biaxial stretch. In some embodiments, the barrier film or article employing the barrier film can have a water vapor transmission rate of less than 0.01 $g/m^2/day$ after 1%, 5%, 10% or 20% uniaxial or biaxial stretch. In some embodiments, the barrier film or article employing the barrier film can have a water vapor transmission rate of less than 0.001 $g/m^2/day$ after 1%, 5%, 10% or 20% uniaxial or biaxial stretch.

Article employing the barrier film can include a device disposed on a barrier film of the present disclosure. In some of these embodiments, the barrier film used in such articles can be uniaxially or biaxially stretched to no less than 1%, no less than 2%, no less than 3%, no less than 5% or no less than 10% relative to its unstretched state and the stretched barrier film is free of fractures.

The following embodiments are intended to be illustrative of the present disclosure and not limiting.

EMBODIMENTS

1. A barrier film comprising:
   (a) a barrier layer having two opposing major surfaces;
   (b) a first organic layer in direct contact with one of the opposing major surfaces of the barrier layer; and
   (c) a second organic layer in direct contact with the other of the opposing major surfaces of the barrier layer;
   (d) a substrate in direct contact with the first organic layer or the second organic layer;
   wherein the barrier layer comprises buckling deformations with average spacing smaller than average spacing of the buckling deformations in the first or second organic layer.

2. A barrier film comprising:
   (a) a barrier layer having two opposing major surfaces, wherein the barrier layer comprises buckling deformations;
   (b) a first organic layer in direct contact with one of the opposing major surfaces of the barrier layer;
   (c) a second organic layer in direct contact with the other of the opposing major surfaces of the barrier layer; and
   (d) a substrate in direct contact with the first organic layer or the second organic layer;
   wherein each of the first organic layer and the second organic layer has a conformable surface conforming to a shape of the barrier layer; and wherein each of the first organic layer and the second organic layer has a substantially flat surface disposed opposite to and spaced apart from the conformable surface.

3. The barrier film of any of embodiments 1 to 2, wherein the substrate is heat-shrinkable.

4. The barrier film of embodiment 3, wherein the heat-shrinkable substrate shrinks at a predetermined temperature.

5. The barrier film of embodiment 3, wherein the heat shrinkable substrate comprises an organic polymer.

6. The barrier film of any one of embodiments 1 to 5, wherein the barrier layer comprises at least one selected from the group consisting of individual metals, two or more metals as mixtures, inter-metallics or alloys, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

7. The barrier film of embodiment 6, wherein the barrier layer comprises metal oxide.

8. The barrier film of embodiment 7, wherein the metal oxide is selected from the group of silicon oxides, aluminum oxides, titanium oxides, indium oxides, tin oxides, indium tin oxide (ITO), halfnium oxide, tantalum oxide, zirconium oxide, zinc oxide, niobium oxide, and combinations thereof.

9. The barrier film of any one of the preceding embodiments, wherein the first organic layer or the second organic layer comprises an acrylate.

10. The barrier film of any one of the preceding embodiments, wherein the barrier film has a water vapor transmission rate of less than 0.1 g/m$^2$/day after 5% uniaxial stretch.

11. The barrier film of any one of the preceding embodiments, wherein the barrier film has a water vapor transmission rate of less than 0.1 g/m$^2$/day after 10% uniaxial stretch.

12. An article comprising a device disposed on a barrier film of embodiments 1 to 11, wherein the barrier film is stretched to no less than 1% relative to its unstretched state.

13. A method of making the barrier film of embodiments 1 to 11, comprising:
depositing a barrier layer between a first organic layer and a second organic layer to form a layer construction; and
applying heat to the layer construction.

14. The method of embodiment 13, wherein forming the layer construction further comprises depositing the first organic layer or the second organic layer on a substrate.

15. A method of making the barrier film of embodiments 1 to 11, comprising:
straining an elastomeric film;
laminating the strained elastomeric film to a rigid substrate;
depositing a barrier layer on the strained elastomeric film;
depositing a first organic layer on the barrier layer; and
releasing the strained elastomeric film from the rigid substrate.

The following working examples are intended to be illustrative of the present disclosure and not limiting.

EXAMPLES

All references and publications cited herein are expressly incorporated herein by reference in their entirety into this disclosure. Illustrative embodiments of this invention are discussed and reference has been made to possible variations within the scope of this invention. For example, features depicted in connection with one illustrative embodiment may be used in connection with other embodiments of the invention. These and other variations and modifications in the invention will be apparent to those skilled in the art without departing from the scope of the invention, and it should be understood that this invention is not limited to the illustrative embodiments set forth herein. Accordingly, the invention is to be limited only by the claims provided below and equivalents thereof.

Test Methods

Water Vapor Transmission Rate (WVTR)

Some of the following Examples were tested for barrier properties on a vapor transmission testing system commercially available as PERMATRAN W700 from Mocon of Minneapolis, Minn. The testing regime was 50° C. and 100% RH.

Examples

The following Examples of barrier films were made on a vacuum coater similar to the coater described in U.S. Pat. No. 8,658,248 (Anderson et al.) and U.S. Pat. No. 7,018,713 (Padiyath, et al.). For examples 1-4, the coater was threaded up with a substrate in the form of an indefinite length roll of 0.0525 mm thick, 14 inch (35.6 cm) wide biaxially oriented PET film, SchotchShield Ultra, commercially available from 3M of St. Paul, Minn. For example 5, the coater was threaded up with a substrate in the form of an indefinite length roll of 0.0525 mm thick, 14 inch (35.6 cm) wide release material commercially available from 3M of St. Paul, Minn., which allowed for the substrate to be subsequently released from the organic and barrier layers after processing the barrier film. This substrate was then advanced at a constant line speed of 16 fpm (4.9 m/min). The substrate was prepared for coating by subjecting it to a 20 W nitrogen plasma treatment to improve the adhesion of the first organic layer.

Example 1

A first organic layer was formed on the PET substrate (ScotchShield Ultra), commercially available from 3M of St. Paul, Minn., by applying tricyclodecane dimethanol diacrylate, commercially available as SARTOMER SR833S from Sartomer USA of Exton, Pa., by ultrasonic atomization and flash evaporation to make a coating width of 12.5 inches (31.8 cm). This monomeric coating was subsequently cured immediately downstream with an electron beam curing gun operating at 7.0 kV and 4.0 mA. The flow of liquid monomer into the evaporator was 1.33 ml/min, the nitrogen gas flow rate was 60 sccm and the evaporator temperature was set at 260° C. The process drum temperature was −10° C.

On top of this first organic layer, a barrier layer of silicon aluminum oxide was deposited by AC reactive sputtering. The cathode had a Si(90%)/Al(10%) target obtained from Soleras Advanced Coatings US, of Biddeford, (Me.). The voltage for the cathode during sputtering was controlled by a feed-back control loop that monitored the voltage and controlled the oxygen flow such that the voltage would remain high and not crash the target voltage. The system was operated at 16 kW of power to deposit a 27 nm thick layer of silicon aluminum oxide onto the organic layer.

A further in-line process was used to deposit a second polymeric layer on top of the silicon aluminum oxide layer. This polymeric layer was produced from monomer solution by atomization and evaporation. However, the material applied to form this top layer was a mixture of 3 wt % (N-(n-butyl)-3-aminopropyltrimethoxysilane commercially available as DYNASILAN 1189 from Evonik of Essen, Del.; with the remainder SARTOMER SR833S. The flow rate of this mixture into the atomizer was 1.33 ml/min, the nitrogen gas flow rate was 60 sccm, and the evaporator temperature was 260° C. Once condensed onto the silicon aluminum oxide layer, the coated mixture was cured with an electron beam curing gun operating at 7.0 kV and 10.0 mA.

The resulted article was tested for water vapor transmission according to the test method discussed above. The water vapor transmission rate in this experiment was found to be below the detection limit for the apparatus.

The resulted article was further processed using a Karo IV batch orienter (Bruckner GmbH) with the temperature in the stretching oven set at 165° C. The article was placed in the loading zone of the Karo by fixing the boundary conditions of the article in one in-plane dimension and allowing the orthogonal in-plane direction to relax by 10% relative to its initial size dimensions when tautly held in the orienter. The article was then sent to the stretch oven for 5 minutes where it was allowed to heat shrink along the dimension relaxed by 10%.

This resulted article was tested for water vapor transmission according to the test method discussed above. The water vapor transmission rate in this experiment was found to be near the detection limit for the apparatus at 0.008 g/m²/day.

The resulted article was further processed using a Karo IV batch orienter (Bruckner GmbH) with the temperature in the stretching oven set at 165° C. The article was placed in the loading zone of the Karo by fixing the boundary conditions of the article in both in-plane dimensions. The article was then sent to the stretch oven for 5 minutes where it was allowed to reach equilibrium under the temperature conditions and then the previously relaxed dimension was stretched 10% relative to its initial size at a constant speed of 1% strain per second.

This resulted article was tested for water vapor transmission according to the test method discussed above. The water vapor transmission rate in this experiment was found to be near the detection limit for the apparatus at 0.008 g/m²/day. Microscopy showed the barrier layer containing regions with and without nanoscale buckling deformations, and the organic layers had a substantially flat surface disposed opposite to and spaced apart from the conformable surface.

Example 2

A barrier film was prepared according to the procedure of Example 1, except that the substrate was pre-treated with a 500 W nitrogen plasma treatment for adhesion promotion. It was tested for water vapor transmission according to the test methods discussed above, and the water vapor transmission rate was found to follow the same trends of near detection limit permeation rates for the test apparatus. The buckling deformations were also substantially limited to the barrier layer as in Example 1.

Example 3

A first organic layer was formed on the substrate of biaxially oriented non-heat-stabilized clear PET from 3M by applying tricyclodecane dimethanol diacrylate, commercially available as SARTOMER SR833S from Sartomer USA of Exton, Pa., by ultrasonic atomization and flash evaporation to make a coating width of 12.5 inches (31.8 cm). This monomeric coating was subsequently cured immediately downstream with a UV light. The UV light was not expected to cause much curing due to the absence of photo initiator. The UV light did have an amount of emission in the 184-244 nm regime that; when combined with the UV emission from the sputter zone, sufficiently resulted in a low modulus layer. The flow of liquid monomer into the evaporator was 3.55 ml/min, the gas flow rate was 60 seem and the evaporator temperature was set at 260° C. The process drum temperature was −10° C.

On top of this first organic layer, a barrier layer was deposited by an AC reactive sputter deposition process employing a 40 kHz AC power supply. The cathode had a Si(90%)/Al(10%) target obtained from Soleras Advanced Coatings US, of Biddeford, (Me.). The voltage for the cathode during sputtering was controlled by a feed-back control loop that monitored the voltage and controlled the oxygen flow such that the voltage would remain high and not crash the target voltage. The system was operated at 16 kW of power to deposit a 27 nm thick layer of silicon aluminum oxide onto the organic layer.

A further in-line process was used to deposit a second polymeric layer on top of the silicon aluminum oxide layer. This polymeric layer was produced from monomer solution by atomization and evaporation. However, the material applied to form this top layer was a mixture of 3 wt % (N-(n-butyl)-3-aminopropyltrimethoxysilane commercially available as DYNASILAN 1189 from Evonik of Essen, Del.; with the remainder SARTOMER SR833S. The flow rate of this mixture into the atomizer was 1.33 ml/min, the gas flow rate was 60 sccm, and the evaporator temperature was 260° C. Once condensed onto the silicon aluminum oxide layer, the coated mixture was cured to a finished polymer with an electron beam curing gun operating at 7.0 kV and 10.0 mA.

The resulted article was tested for water vapor transmission according to the test method discussed above. The water vapor transmission rate in this experiment was found to be 0.01 g/m²/day.

The resulted article was further processed using a Karo IV batch orienter (Bruckner GmbH) with the temperature in the stretching oven set at 220° C. The article was placed in the loading zone of the Karo by fixing the boundary conditions of the article in both in-plane dimensions and then allowing both the in-plane directions to relax by 5% relative to its initial size dimensions when tautly held in the orienter. The article was then sent to the stretch oven for 5 minutes where it was allowed to heat shrink along the dimensions relaxed by 5%.

This resulted article was tested for water vapor transmission according to the test method discussed above. The water vapor transmission rate in this experiment was found to be below the detection limit for the apparatus. The resulting article was visibly translucent after the heating step due to the macroscale buckling of the acrylate layer which scattered visible light. As observed with microscopy the process resulted in nanoscale buckling of the oxide as well.

Example 4

A barrier film was prepared according to the procedure of Example 3, except that the flow of liquid into the evaporator was 2.66 ml/min. It was tested for water vapor transmission according to the test methods discussed above, and the water vapor transmission rate and buckling deformation pattern was found to follow the same trends.

Example 5

A first organic layer was formed on the release substrate by applying tricyclodecane dimethanol diacrylate, commercially available as SARTOMER SR833S from Sartomer USA of Exton, Pa., by ultrasonic atomization and flash evaporation to make a coating width of 12.5 inches (31.8 cm). This monomeric coating was subsequently cured immediately downstream with an electron beam curing gun operating at 7.0 kV and 4.0 mA. The flow of liquid into the evaporator was 1.33 ml/min, the gas flow rate was 60 seem and the evaporator temperature was set at 260° C. The process drum temperature was −10° C.

On top of this first organic layer, a barrier layer was deposited by an AC reactive sputter deposition process employing a 40 kHz AC power supply. The cathode had a Si(90%)/Al(10%) target obtained from Soleras Advanced Coatings US, of Biddeford, (Me.). The voltage for the cathode during sputtering was controlled by a feed-back control loop that monitored the voltage and controlled the oxygen flow such that the voltage would remain high and not crash the target voltage. The system was operated at 16 kW of power to deposit a 27 nm thick layer of silicon aluminum oxide onto the organic layer.

A further in-line process was used to deposit a second polymeric layer on top of the silicon aluminum oxide layer. This polymeric layer was produced from monomer solution by atomization and evaporation. However, the material applied to form this top layer was a mixture of 3 wt % (N-(n-butyl)-3-aminopropyltrimethoxysilane commercially available as DYNASILAN 1189 from Evonik of Essen, Del.; with the remainder SARTOMER SR833S. The flow rate of this mixture into the atomizer was 1.33 ml/min, the gas flow rate was 60 sccm, and the evaporator temperature was 260° C. Once condensed onto the silicon aluminum oxide layer, the coated mixture was cured to a finished polymer with an electron beam curing gun operating at 7.0 kV and 10.0 mA.

The resulting article could release its organic and inorganic barrier layer components upon contact with an adhesive in a standard transfer process.

As described in U.S. Pat. No. 6,869,666 (Deeb et al.) and U.S. Pat. No. 8,979,536 (Jones, et al.), an elastomeric 3-layer film 0.132 mm thick and 15 cm by 30 cm in dimension was strained in the long dimension by 25% to 38 cm and fixed at is boundaries in a batch setup. The film was then strained in orthogonal direction along is boundaries to compensate for the Poisson effect and bring its lateral dimension back to its pre-strained dimension. A polyisobutylene adhesive 0.0508 mm thick was laminated to the strained elastomeric film and then the barrier layer was transferred to the adhesive. This transfer process was repeated four times, and then the film was relaxed. Upon relaxation, macroscale buckling deformations were formed perpendicular to the long dimension which resulted in the film becoming translucent.

This resulted article was stretched to 20% strain along the long axis and then allowed to relax before it was tested for water vapor transmission according to the test method discussed above. The water vapor transmission rate in this experiment was found to be 0.02 g/m²/day.

What is claimed is:

1. A barrier film comprising: (a) a barrier layer having two opposing major surfaces; (b) a first organic layer in direct contact with one of the opposing major surfaces of the barrier layer; and (c) a second organic layer in direct contact with the other of the opposing major surfaces of the barrier layer; (d) a substrate in direct contact with the first organic layer or the second organic layer; wherein the barrier layer, the first organic layer, and the second organic layer each comprise buckling deformations and wherein the buckling deformations of the barrier layer have an average spacing smaller than the average spacing of the buckling deformations in the first or second organic layer.

2. The barrier film of claim 1, wherein the substrate is heat-shrinkable.

3. The barrier film of claim 2, wherein the heat-shrinkable substrate shrinks at a predetermined temperature.

4. The barrier film of claim 2, wherein the heat shrinkable substrate comprises an organic polymer.

5. The barrier film of claim 1, wherein the barrier layer comprises at least one selected from the group consisting of individual metals, two or more metals as mixtures, intermetallics or alloys, metal oxides, metal and mixed metal oxides, metal and mixed metal fluorides, metal and mixed metal nitrides, metal and mixed metal carbides, metal and mixed metal carbonitrides, metal and mixed metal oxynitrides, metal and mixed metal borides, metal and mixed metal oxy borides, metal and mixed metal silicides, and combinations thereof.

6. The barrier film of claim 5, wherein the barrier layer comprises metal oxide.

7. The barrier film of claim 6, wherein the metal oxide is selected from the group of silicon oxides, aluminum oxides, titanium oxides, indium oxides, tin oxides, indium tin oxide (ITO), halfnium oxide, tantalum oxide, zirconium oxide, zinc oxide, niobium oxide, and combinations thereof.

8. The barrier film of claim 1, wherein the first organic layer or the second organic layer comprises an acrylate.

9. The barrier film of claim 1, wherein the barrier film has a water vapor transmission rate of less than 0.1 g/m²/day after 5% uniaxial stretch.

10. The barrier film of claim 1, wherein the barrier film has a water vapor transmission rate of less than 0.1 g/m²/day after 10% uniaxial stretch.

11. An article comprising a device disposed on the barrier film of claim 1, wherein the barrier film is stretched to no less than 1% relative to its unstretched state.

12. A method of making the barrier film of claim 1, comprising:
depositing a barrier layer between a first organic layer and a second organic layer to form a layer construction; and
applying heat to the layer construction.

13. The method of claim 12, wherein forming the layer construction further comprises depositing the first organic layer or the second organic layer on a substrate.

14. A method of making the barrier film of claim 1, comprising:
straining an elastomeric film;
laminating the strained elastomeric film to a rigid substrate;
depositing a barrier layer on the strained elastomeric film;
depositing a first organic layer on the barrier layer; and
releasing the strained elastomeric film from the rigid substrate.

* * * * *